United States Patent
Farrugia

(10) Patent No.: US 9,759,754 B2
(45) Date of Patent: Sep. 12, 2017

(54) PHASE ANGLE MEASUREMENT USING RESIDUE NUMBER SYSTEM ANALOGUE-TO-DIGITAL CONVERSION

(71) Applicant: Airbus Defence and Space Limited, Stevenage (GB)

(72) Inventor: Lewis Farrugia, Stevenage (GB)

(73) Assignee: Airbus Defence and Space Limited, Stevenage (GB)

( * ) Notice: Subject to any disclaimer, the term of this patent is extended or adjusted under 35 U.S.C. 154(b) by 0 days.

(21) Appl. No.: 15/023,675

(22) PCT Filed: Sep. 26, 2014

(86) PCT No.: PCT/GB2014/052922
§ 371 (c)(1),
(2) Date: May 11, 2016

(87) PCT Pub. No.: WO2015/044675
PCT Pub. Date: Apr. 2, 2015

(65) Prior Publication Data
US 2016/0291069 A1      Oct. 6, 2016

(30) Foreign Application Priority Data
Sep. 30, 2013   (EP) .................................. 13275234

(51) Int. Cl.
*G01R 25/00*       (2006.01)
*H03D 13/00*       (2006.01)
*H04L 27/233*      (2006.01)

(52) U.S. Cl.
CPC ........... *G01R 25/00* (2013.01); *H03D 13/003* (2013.01); *H04L 27/2338* (2013.01)

(58) Field of Classification Search
CPC ........... H04B 2001/71563; H04B 2001/71566; H04L 7/0029; H04L 7/005; H04L 7/0079; H04L 27/3818
USPC ................ 375/224, 316–317, 322, 324–325, 375/331–332
See application file for complete search history.

(56) References Cited

U.S. PATENT DOCUMENTS

| 4,983,970 A * | 1/1991 | O'Donnell ........... G10K 11/346 341/122 |
| 5,230,011 A * | 7/1993 | Gielis ...................... H04N 5/44 348/E5.096 |
| 5,289,257 A * | 2/1994 | Kurokawa ............. G01C 19/72 356/463 |

(Continued)

OTHER PUBLICATIONS

International Search Report and Written Opinion for PCT/GB2014/052922 mailed Oct. 31, 2014.

(Continued)

*Primary Examiner* — Emmanuel Bayard
(74) *Attorney, Agent, or Firm* — Chang & Hale LLP

(57) ABSTRACT

A phase angle can be measured between an analog signal and a reference signal by converting the analog signal to digital samples in a residue number system (RNS) analog-to-digital converter (ADC), based on a RNS scheme. The phase angle can be measured directly from the RNS values output by the RNS ADC, or the RNS values can be converted to a binary scheme, such as straight binary, offset binary or two's complement, before calculating the phase angle measurement.

13 Claims, 5 Drawing Sheets

(56) References Cited

U.S. PATENT DOCUMENTS

| | | | | |
|---|---|---|---|---|
| 5,841,323 A * | 11/1998 | Fujimoto | | H03L 7/113 331/11 |
| 5,892,632 A * | 4/1999 | Behrens | | G11B 5/09 360/51 |
| 6,534,969 B1 * | 3/2003 | Dietmayer | | G01D 5/2448 324/207.12 |
| 6,965,332 B2 * | 11/2005 | Nakamura | | H03M 1/0687 341/118 |
| 7,148,828 B2 * | 12/2006 | Fernandez | | H03M 1/10 341/120 |
| 7,408,490 B2 * | 8/2008 | Melanson | | H03M 1/1033 341/120 |
| 7,440,596 B2 * | 10/2008 | Kondo | | G06K 9/00087 283/68 |
| 7,561,092 B2 * | 7/2009 | Tero | | H03M 1/206 341/155 |
| 7,623,050 B2 * | 11/2009 | Le | | H03M 1/1023 341/118 |
| 7,750,685 B1 * | 7/2010 | Bunch | | H03L 7/087 327/23 |
| 7,830,954 B2 * | 11/2010 | Welz | | H03D 3/009 375/219 |
| 7,859,255 B2 * | 12/2010 | Doogue | | G01R 33/093 257/427 |
| 7,956,694 B1 * | 6/2011 | Wilson | | H03L 7/087 315/194 |
| 8,165,835 B1 * | 4/2012 | Singh | | G01R 21/1331 324/141 |
| 8,300,730 B2 * | 10/2012 | Voloshin | | H04L 27/2078 375/273 |
| 8,552,899 B2 * | 10/2013 | Samid | | H03M 1/122 341/155 |
| 8,686,771 B2 * | 4/2014 | Frantzeskakis | | H03L 7/10 327/150 |
| 8,868,379 B2 * | 10/2014 | Okada | | G01B 9/02003 356/484 |
| 8,885,692 B2 * | 11/2014 | Ly-Gagnon | | H04L 27/364 375/219 |
| 9,013,819 B1 * | 4/2015 | Zou | | G11B 5/59616 360/51 |
| 9,081,041 B2 * | 7/2015 | Friedrich | | G01R 15/207 |
| 2003/0090969 A1 * | 5/2003 | Matsumoto | | G11B 7/0065 369/44.34 |
| 2006/0200510 A1 * | 9/2006 | Wang | | G06F 7/4818 708/200 |
| 2008/0253481 A1 | 10/2008 | Rivkin et al. | | |
| 2008/0304666 A1 * | 12/2008 | Chester | | H04J 13/0003 380/263 |
| 2010/0091700 A1 * | 4/2010 | Michaels | | H04W 48/16 370/328 |
| 2010/0123621 A1 | 5/2010 | Craig et al. | | |
| 2012/0320381 A1 * | 12/2012 | Okada | | G01B 9/02059 356/484 |
| 2014/0307263 A1 * | 10/2014 | Hatada | | G01B 9/02007 356/484 |

OTHER PUBLICATIONS

Pham, et al., "Preprocessing for analog signal conversion using novel number system", Digital Signal Processing, Academic Press, vol. 21, No. 1, Jan. 1, 2011, pp. 150-161.

Pace, et al., "An Optimum SNS-to-Binary Conversion Algorithm and Pipelined Field-Programmable Logic Design", IEEE Transactions on Circuits and Systems II: Analog and Digitalsignal Processing, Institute of Electrical and Electronics Engineers, Inc., vol. 47, No. 8, Aug. 1, 2000, pp. 736.

* cited by examiner

PHASE ANGLE MEASUREMENT USING RESIDUE NUMBER SYSTEM ANALOGUE-TO-DIGITAL CONVERSION

TECHNICAL FIELD

The present invention relates to measuring a phase angle. More particularly, the present invention relates to measuring a phase angle by converting an analogue signal to a digital signal in a residue number system (RNS) analogue-to-digital converter (ADC), and measuring the phase angle from the digital signal output by the RNS ADC.

BACKGROUND OF THE INVENTION

Communications satellites which receive analogue signals, for example from a ground-based transmitter or from another satellite, can be arranged to convert the analogue signals into the digital domain for onboard processing. The received analogue signal is converted using an analogue-to-digital converter (ADC), which measures the signal level, e.g. voltage or current, at a particular time and outputs a codeword representing the measured signal level. Therefore the digital signal output by the ADC comprises a sequence of codewords representing the variation in the received signal level over time.

Also, in signal processing applications it can be necessary to accurately measure the phase angle of the signal being processed. For example, when quadrature amplitude modulation (QAM) schemes are used, the angular separation between distinct symbols referred to the origin of the constellation decreases as the order of modulation is increased. Therefore accurate phase angle measurement is desirable to ensure that symbols can be reliably distinguished. Errors can be present in the signal as-received, for example as Gaussian noise, or can be introduced by various components before the digital signal processor (DSP). In the case of conversion from an analogue to a digital signal by an ADC, systematic errors can be introduced by the ADC itself. For instance, it is known that ADCs can suffer from integral non-linearity (INL) and differential non-linearity (DNL) effects which reduce the dynamic range for which the ADC can be used.

The invention is made in this context.

SUMMARY OF THE INVENTION

According to the present invention, there is provided apparatus for measuring a phase angle from an analogue signal, the apparatus comprising: a residue number system RNS analogue-to-digital converter ADC arranged to output a plurality of digital samples from the first analogue signal according to a RNS scheme; and a phase measurement module arranged to measure a phase angle between the analogue signal and a reference signal, based on the reference signal and the digital samples output by the RNS ADC.

The apparatus can further comprise: a RNS-to-binary converter connected between the RNS ADC and the phase measurement module, the RNS-to-binary converter being arranged to convert the RNS digital samples to binary values according to a binary coding scheme, wherein the phase measurement module is arranged to measure the phase angle based on the reference signal and the converted digital samples from the RNS-to-binary converter.

The phase measurement module can comprise: a quadrature reference signal generator arranged to generate sine and cosine waveforms according to a frequency of the reference signal; a first multiplier arranged to multiply the digital samples by the cosine waveform to obtain an in-phase I signal component; a second multiplier arranged to multiply the digital samples by the sine waveform to obtain a quadrature Q signal component; a first integrator arranged to integrate the I signal component over time; a second integrator arranged to integrate the Q signal component over time; and a phase angle calculator arranged to calculate the phase angle measurement from the integrated I and Q signal components.

The first and second integrators can be arranged to integrate the I and Q signal components over a time period equal to an integer number of cycles of the reference frequency.

The phase angle calculator can be arranged to calculate the phase angle measurement using a Coordinate Rotation Digital Computer CORDIC algorithm.

The apparatus can be included in a system comprising: a main signal path including an analogue-to-digital converter ADC (110) arranged to convert an input signal to a digital signal, a digital signal processor (112) arranged to perform digital signal processing on the digital signal, and a digital-to-analogue converter DAC (114) arranged to convert the processed digital signal to an output signal, wherein the apparatus can be arranged to receive the output signal from the DAC as the analogue signal for measuring the phase angle, and wherein the reference signal is injected into the main signal path before the ADC.

The apparatus can be included in a satellite, such as a communications satellite.

According to the present invention, there is also provided a method of measuring a phase angle between an analogue signal and a reference signal, the method comprising: using a residue number system RNS analogue-to-digital converter ADC to output a plurality of digital samples from the analogue signal according to a RNS scheme; and measuring a phase angle based on the reference signal and the digital samples.

The method can further comprise: converting the RNS digital samples to binary values according to a binary coding scheme, wherein the phase angle can be measured based on the reference signal and the converted digital samples.

Measuring the phase angle can comprise: generating sine and cosine waveforms according to a frequency of the reference signal; multiplying the digital samples by the cosine waveform to obtain an in-phase I signal component; multiplying the digital samples by the sine waveform to obtain a quadrature Q signal component; integrating the I signal component over time; integrating the Q signal component over time; and calculating the phase angle measurement from the integrated I and Q signal components.

The I and Q signal components can be integrated over a time period equal to an integer number of cycles of the reference signal.

The phase angle measurement can be calculated using a Coordinate Rotation Digital Computer CORDIC algorithm.

The method can further comprise: injecting the reference signal into a main signal path including an analogue-to-digital converter ADC (110) arranged to convert an input signal to a digital signal, a digital signal processor (112) arranged to perform digital signal processing on the digital signal, and a digital-to-analogue converter DAC (114) arranged to convert the processed digital signal to an output signal; and receiving the output signal from the DAC as the analogue signal for measuring the phase angle.

BRIEF DESCRIPTION OF THE DRAWINGS

Embodiments of the present invention will now be described, by way of example only, with reference to the accompanying drawings, in which.

DETAILED DESCRIPTION

Figure 1:
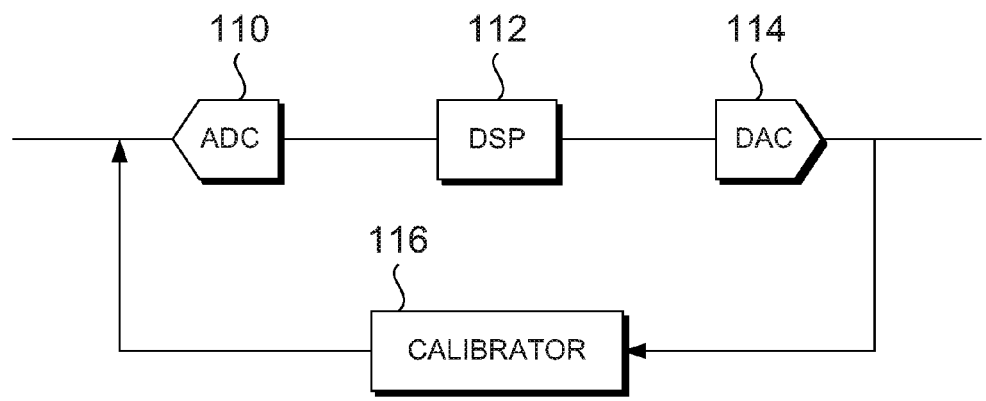
FIG. 1 illustrates a signal processing system for use in a communications satellite.

Referring now to FIG. 1, a signal processing system for use in a communications satellite is illustrated. The system comprises an ADC 110, a DSP 112 connected to the output of the ADC 110, and a digital-to-analogue converter (DAC) 114 connected to the output of the DSP 112. An analogue signal is input to the ADC 110 and converted to a digital signal, which is then processed by the DSP 112. The processed digital signal is then converted back into the analogue domain by the DAC 114.

As shown in FIG. 1, in the present embodiment a DSP calibrator 116 is used to check whether the signal phase is correctly preserved through the transitions from analogue to digital and back to analogue. The DSP calibrator 116 operates by injecting a known reference signal to the ADC 110 input, at a frequency chosen so as not to interfere with other frequencies present in the input signal being processed. The DSP calibrator 116 re-converts the analogue output of the DAC 114 back to a digital representation using its own ADC, i.e. a further ADC included in the calibrator 116, and then correlates this signal with its own local digital I, Q digital reference signals, from which a phase angle is measured. The phase-angle measurement leads to a phase-delay by systematic inference, given the known frequency of the reference signals. Therefore the DSP calibrator 116 can compare the reference signal at the DAC 114 output to the input reference signal to determine whether the reference signal phase has been preserved or whether phase errors have been introduced.

Figure 2:
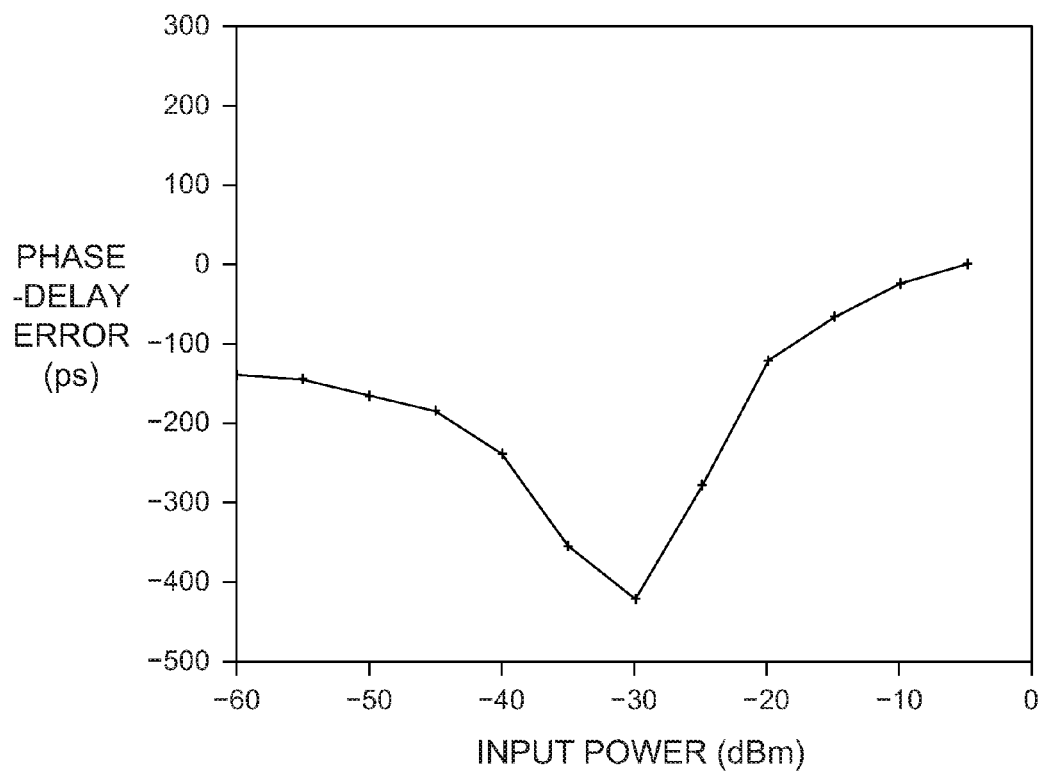
FIG. 2 is a graph plotting phase-delay error against input signal power for the system of FIG. 1.

FIG. 2 is a graph plotting phase-delay error against input signal power for the system of FIG. 1. The phase-delay error is measured in picoseconds (ps) and the input signal power is measured in decibels referenced to one milliwatt (dBm). The phase-delay error is the error inherent in measurements obtained by the DSP calibrator 116 for a reference signal comprising a constant tone at 9.80 megahertz (MHz). As shown in FIG. 2, at low input signal powers phase-delay errors of as much as several hundred ps are inferred as a result of the phase being incorrectly measured by the correlator, with the result that the phase angle is incorrectly measured by the correlator in the DSP calibrator 116. Investigations by the inventor have revealed that the source of this phase-delay anomaly at low signal powers is digital-to-analogue interference between the ADC output and the ADC input in the calibrator 116. Specifically, different output codewords can interfere differently with the input analogue signal, depending on the voltage levels in each codeword.

Figure 3:
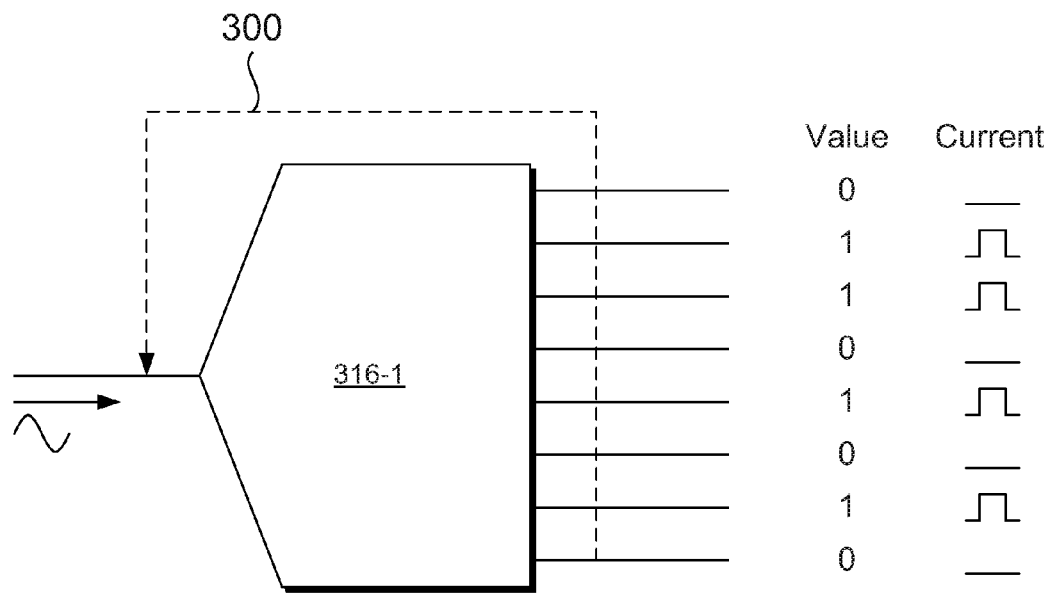
FIG. 3 illustrates digital-to-analogue interference in the output signal of an ADC.

Digital-to-analogue interference in the ADC 316-1 of the DSP calibrator 116 of FIG. 1 is illustrated schematically in FIG. 3. A leakage path 300 exists between the ADC output bus and the ADC input, meaning that the input signal can be influenced by current levels in the codeword presently being output by the ADC 316-1. Such a leakage path may be present in any ADC since in practice the input and output are not perfectly isolated, meaning that a phase-delay anomaly may still occur regardless of the type of ADC used in the calibrator 116.

In more detail, as shown in FIG. 3 the ADC output bus includes a plurality of signal lines each arranged to carry one bit of the output codeword. In the present example the ADC 316-1 is an 8-bit ADC, but the present invention is generally applicable to ADCs of any resolution. As the operating principles of ADCs are well-known, a detailed description will not be provided here. As shown in FIG. 3, the level of current on each of the output lines depends on whether that bit of the codeword presently being output is set to 0 or 1, i.e. whether the voltage is set to low or high. Specifically, when the voltage of a bit is set to high, representing a binary value of 1, a higher current flows in the signal line carrying that bit than in a signal line carrying a binary value of 0. The highest output current will be obtained when all bits of the output codeword are set to 1, and the lowest output current will be obtained when all bits of the output codeword are set to 0. Therefore the strength of the digital-to-analogue interference at any point in time will depend on the number of bits set to 1 in the codeword currently being output by the ADC 316-1. That is, the interference will be stronger when more bits are set to 1 because the mean output current will be higher.

The skilled person will understand that although the exemplary current levels shown in FIG. 3 correspond to one particular electrical protocol, in which a high voltage level represents a value of 1 and a low voltage level represents a value of 0, the present invention is not limited to use with such protocols. In other embodiments other electrical protocols may be used, for instance the level of current in both the 1 and 0 states may be the same, with only the current direction changing. In any case, regardless of the particular protocol used it may be assumed that the level of interference varies according to the logic values of bits in the codeword, e.g. the number of bits set to 1, and/or the number of 1-to-0 and 0-to-1 transitions relative to the preceding codeword, i.e. the difference between logic values of bits in the current codeword and the logic values of corresponding bits in the preceding codeword.

The number of bits set to 1 in a codeword can be represented by the Hamming weight of the codeword. Consequently, the interfering signal between the ADC output and the ADC input will hereinafter be referred to as the "Hamming interferer". The Hamming weight is the digit sum of a binary number, and can also be referred to as the "population count" or the "sideways sum". For example, the Hamming weight of an 8-bit binary number can be any integer between 0 (i.e. all bits set to 0) and 8 (i.e. all bits set to 1). In the example of FIG. 3, the 8-bit codeword 01101010 has a Hamming weight of 4 (0+1+1+0+1+0+1+0).

In embodiments of the present invention, a sample from an analogue signal is converted into a digital value according to a residue number system (RNS) scheme. In a RNS scheme, an integer value X is represented by reference to a set of smaller integers, referred to as the moduli.

In the RNS defined by i moduli $\{m_1, \ldots m_i\}$ an integer X can be represented by the set of division residues $\{x_1, \ldots x_i\}$. The division residue $x_i$ with respect to the $i^{th}$ modulus $m_i$ is given by:

$$x_i = X - \left\lfloor \frac{X}{m_i} \right\rfloor m_i$$

where $$\left\lfloor \frac{X}{m_i} \right\rfloor$$

denotes the floor function of the real number $$\frac{X}{m_i}.$$

The arithmetic range M of a RNS scheme is given by the least common multiple (LCM) of the moduli. The RNS scheme can represent any integer in the range $0 \leq X \leq M-1$. Preferably, to make the most efficient use of the arithmetic range offered by the moduli, co-prime moduli should be chosen. The use of co-prime moduli ensures that every integer value within the arithmetic range is represented by a unique set of residues. When non-coprime moduli are used a lower range is obtained, meaning that fewer values can be uniquely represented. For example, RNS[4,2] has non-coprime moduli 4 and 2. The LCM of 4 and 2 is 4, meaning that the valid fundamental range for RNS[4,2] is only 0, 1, 2 and 3.

Figure 4:
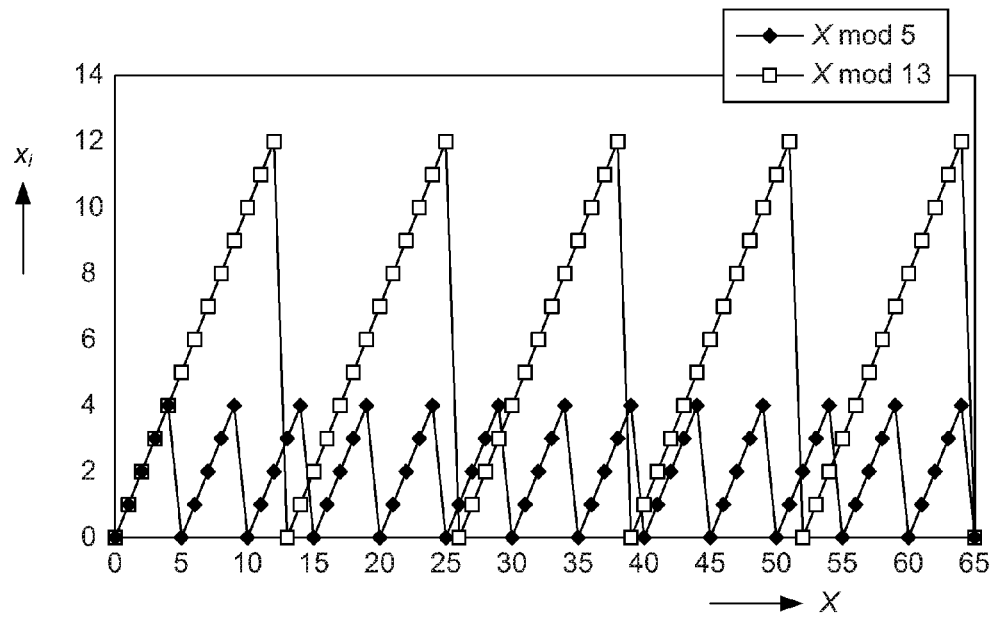
FIG. 4 is a graphical representation of the residues for integers in the range 0 to 65 in the RNS[5,13] scheme.

FIG. 4 is a graphical representation of the residues for integers in the range 0 to 65 in the RNS[5,13] scheme. A RNS ADC which uses RNS[5,13] will have a resolution of 65 (i.e. 5×13), and is therefore comparable to a conventional straight binary 6-bit ADC which has a resolution of 64 (i.e. $2^6$). FIG. 4 plots the residues $x_i$ against the integer value X. As shown in FIG. 4, any integer in the range 0 to 64 can be represented by a unique set of residues. For example, the decimal value 37 is represented by the set of residues {2,11}, the decimal value 9 is represented by the set of residues {4,9}, and so on.

In the example of FIG. 4, the residue for modulus 5 can take any value from 0 to 4, and so 3 bits are required to represent the modulus 5 in binary. Also, the residue for modulus 13 can take any value from 0 to 12, and so 4 bits are required to represent the modulus 13 in binary. An RNS ADC outputs digital samples that are expressed as a set of residues with respect to moduli of the RNS scheme. Therefore a RNS ADC using RNS[5,13] requires a 7-bit output bus to output binary representations of the RNS moduli. This results in a 1-bit overhead in comparison to a straight binary 6-bit ADC.

This additional overhead cost is not restricted to the example of a 6-bit ADC. As a general rule, to achieve any given resolution a RNS ADC will require an output bus with more bits than a straight binary ADC. In addition, the use of an RNS ADC either requires subsequent signal processing arithmetic to be performed in RNS, or requires the RNS digital samples to be converted to conventional binary. For these reasons, RNS ADCs are not widely used.

However, investigations by the inventor have revealed that RNS ADCs offer a surprising advantage in the context of phase angle measurement. The RNS architecture has the effect of de-correlating the spectral relationship between the wanted tone, which is the tone from which the phase angle measurement is taken, and the Hamming interferer. Because the temporal coherence between the Hamming interferer and the wanted tone is reduced in an RNS ADC, the impact of the Hamming interferer on the wanted tone is less significant for RNS ADCs than for other ADC designs.

Figure 5:
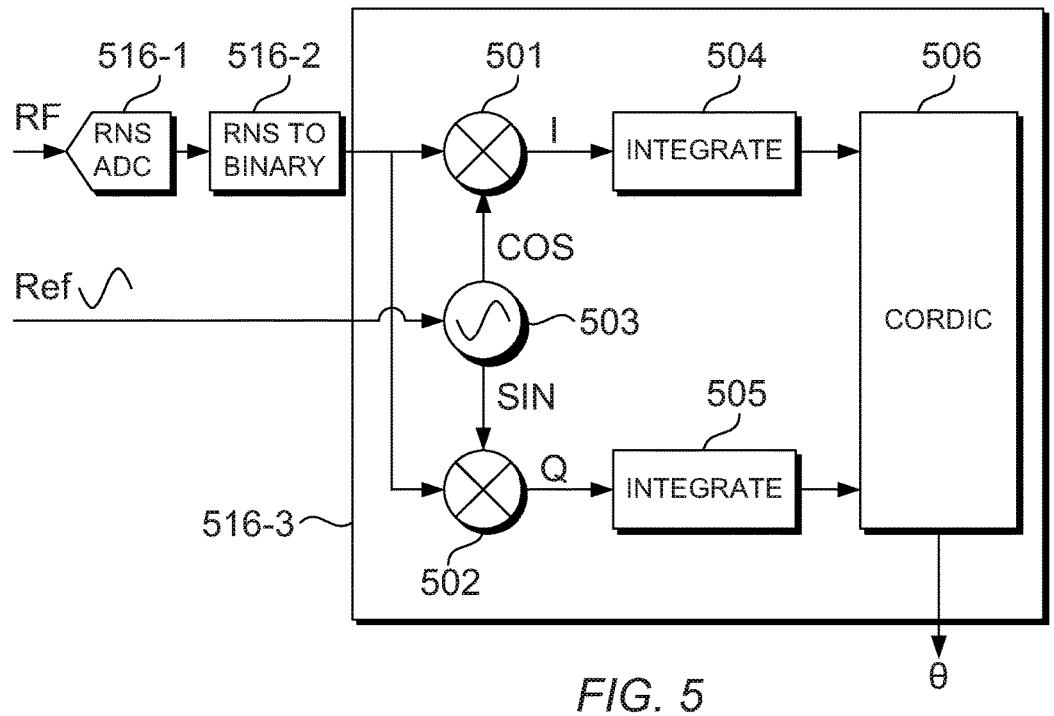
FIG. 5 illustrates apparatus for measuring a phase angle, according to an embodiment of the present invention.

Referring now to FIG. 5, apparatus for measuring a phase angle is illustrated according to an embodiment of the present invention. The apparatus can be included in the calibrator of FIG. 1 for measuring a phase angle between a copy of the reference signal and the DAC 114 output signal to check whether the reference signal phase has been correctly preserved through the DSP 112. However, the invention is not limited to this application, and embodiments of the invention can be used in any application where phase angle measurement is required.

As shown in FIG. 5, the apparatus comprises a RNS ADC 516-1, a RNS-to-binary converter 516-2 arranged to convert the RNS values output by the RNS ADC 516-1 to conventional binary values, and a phase measurement module 516-3 which receives the digital output from the RNS ADC 516-1 and outputs a phase angle measurement θ. In other embodiments the RNS-to-binary converter 516-2 can be omitted, and the phase measurement module 516-3 can calculate the phase angle measurement directly from the RNS values output by the RNS ADC 516-1.

In the present embodiment, the phase measurement module 516-3 comprises first and second quadrature multipliers 501, 502 and a signal generator 503. The signal generator 503 is arranged to receive the reference signal (ref) supplied to the DSP, and generate sine and cosine quadrature reference signals at the frequency of the reference signal. The first and second quadrature multipliers 501, 502 are arranged to multiply the digital ADC output signal with the sine and cosine quadrature reference signals to generate in-phase (I) and quadrature (Q) signal components.

The phase measurement module 516-3 further comprises first and second quadrature integrators 504, 505 which are arranged to integrate the results of the quadrature multipliers 501, 502 in time. In the present embodiment, the quadrature integrators 504, 505 are arranged to perform integration over an integration period chosen to be an integer number of cycles of the reference frequency, which is the frequency of the reference signal (Ref). The effect of integrating over an integer number of cycles of the reference frequency is to reject most of the RF input signal content at frequencies other than the reference frequency, similar to a selective bandpass filtering function. This has the advantage of effectively rejecting energy from the Hamming interferer in bins separate from the bin in which the integration peak falls, which is the bin corresponding to the reference frequency.

The phase measurement module 516-3 further comprises a phase angle calculator 506 in the form of a Coordinate Rotation Digital Computer (CORDIC) block. The CORDIC 506 is arranged to receive the integration results from the first and second quadrature integrators 504, 505 and calculate the inverse tangent function from the I and Q integration results, to give the phase angle measurement θ. Although in the present invention a CORDIC algorithm is used, embodiments of the present invention are not limited to the CORDIC implementation. The CORDIC algorithm is well-known, and is an efficient method of serially calculating the inverse tangent function. However, other algorithms may be used instead of CORDIC in other embodiments.

As described above, when a straight binary ADC is used the Hamming interferer is tightly coupled to the wanted tone, such that most of the energy from the Hamming interferer occurs at the same frequency as the wanted tone. This means that the values obtained by the integrators 504, 505 at the frequency bin for the wanted tone, i.e. the reference frequency, are significantly affected by the Hamming interferer. However, in embodiments of the present invention, the RNS ADC breaks up the spectral relationship between the Hamming interferer and the wanted tone, with the result that the energy from the Hamming interferer is distributed across many frequency bins. This energy is discarded during the integration stage, and the impact of the Hamming interferer on the value in the wanted frequency bin is correspondingly reduced.

Although in the present embodiment, RNS-to-binary conversion is performed before performing quadrature conversion to obtain I and Q signal components, in other embodiments RNS-to-binary conversion can be performed at a different point, for example between the quadrature multipliers 501, 502 and the integrators 504, 505.

Furthermore, although in the present embodiment the phase measurement module 516-3 uses I/Q processing to measure the phase angle, in other embodiments the phase measurement module may obtain the phase angle through a different method. For example, in an alternative embodiment the phase measurement module can be arranged to analyse the digital samples from the RNS ADC by using a Fourier transform, and to infer phase information relating to the analogue signal from the complex coefficient of the relevant frequency bin. In this approach, the reference signal can be subjected to the same analysis, and the required phase angle can then be derived by computing the difference.

Figure 6:
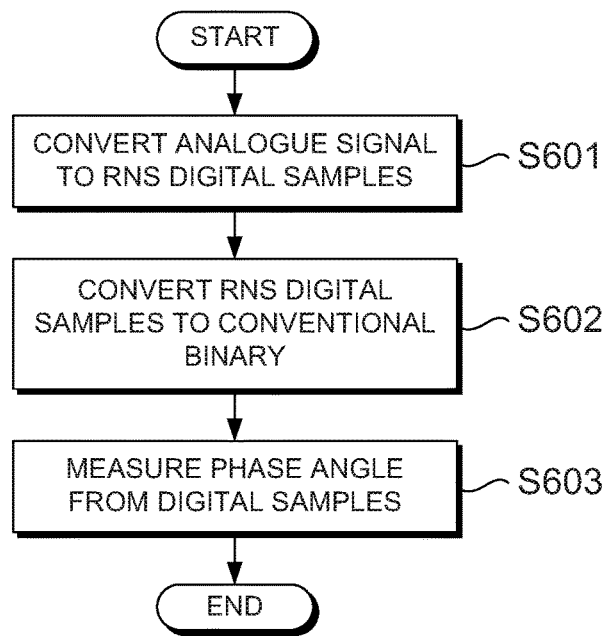
FIG. 6 illustrates a method of measuring a phase angle, according to an embodiment of the present invention.

Referring now to FIG. 6, a method of measuring a phase angle is illustrated according to an embodiment of the present invention. First, in step S601, an analogue signal is sampled and converted to digital samples in the form of RNS values. The RNS value for each sample of the analogue signal is expressed as a set of residues. Step S601 corresponds to the sampling and conversion function performed by a RNS ADC, for example the RNS ADC 516-1 of FIG. 5.

Next, in step S602 the digital samples are converted from RNS to a conventional binary coding scheme, for example straight binary, offset binary or two's complement. Converting the RNS values to conventional binary values has the advantage that standard binary arithmetic blocks such as adders and multipliers can be used. Step S602 corresponds to the conversion performed by the RNS-to-binary converter 516-2 of FIG. 5. Alternatively, in some embodiments step S602 can be omitted, and a phase angle can be calculated directly from the RNS values. Retaining the digital samples as RNS values can enable the phase angle measurement to be calculated faster, since RNS arithmetic is carry-free and can be performed in fewer steps than conventional binary arithmetic.

Next, in step S603 a phase angle is measured from the digital samples. This step can be performed by a phase angle measurement module such as the one shown in FIG. 5. However, as explained above, embodiments of the present invention are not limited to use of a CORDIC algorithm for calculating a phase angle, and in other embodiments different methods of calculating a phase angle can be used.

As described above, using a RNS ADC to perform analogue-to-digital conversion in phase measurement applications provides the advantage that the effect of the Hamming interferer within the ADC is reduced, relative to other ADC designs. FIGS. 7A, 7B, 8A and 8B graphically illustrate the improvement in the carrier-to-interference ratio (C/I), for a range of input signal powers, when a RNS ADC is used instead of a straight binary ADC.

Figure 7A:
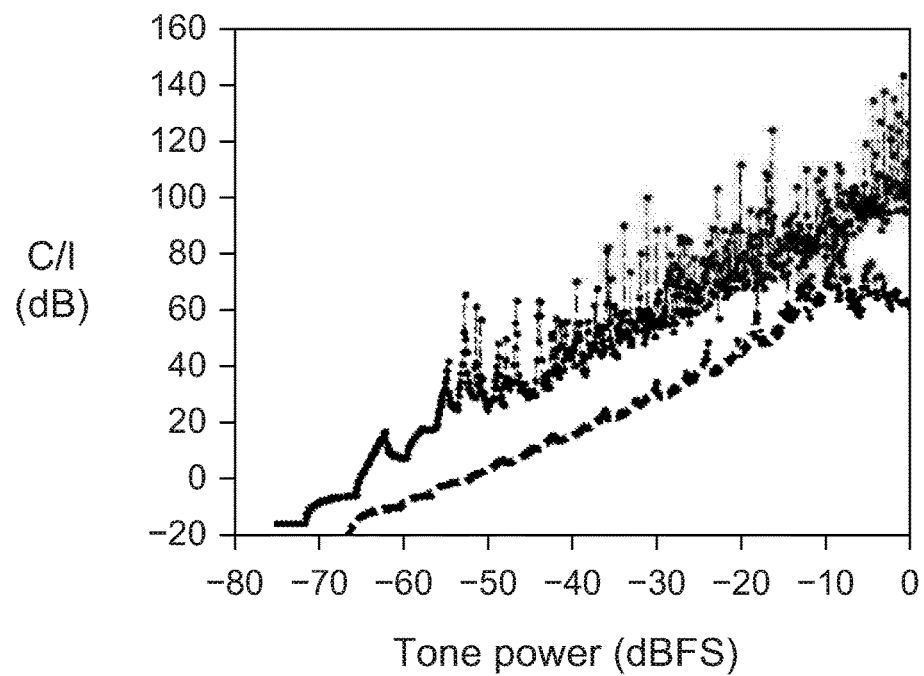
FIGS. 7A and 7B graphically illustrate the improvement in the carrier-to-interference ratio when a RNS ADC is substituted for a conventional 12-bit ADC, according to an embodiment of the present invention.
Figure 7B:
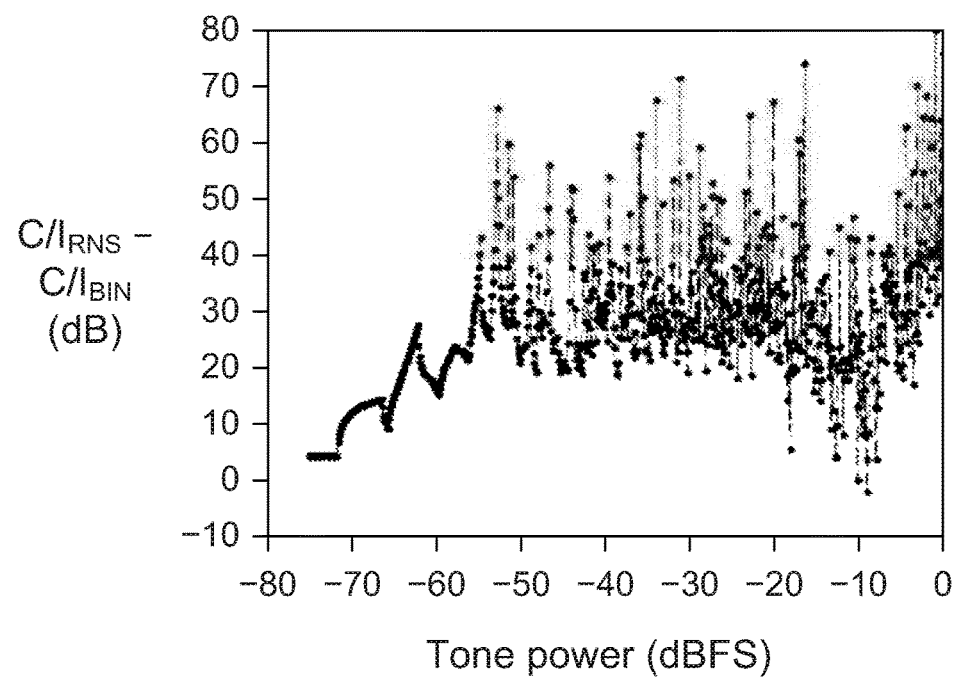

FIG. 7A plots the C/I in decibels (dB) against tone power in decibels relative to full scale (dBFS) for a conventional 12-bit ADC (dashed line in FIG. 7A) and for a RNS ADC (solid line in FIG. 7A) using RNS [2, 3, 5, 11, 23], and FIG. 7B plots the difference in C/I between the 12-bit ADC and the RNS ADC. For most input signal powers, the RNS ADC achieves an improvement of around 20 to 30 dB.

Figure 8A:
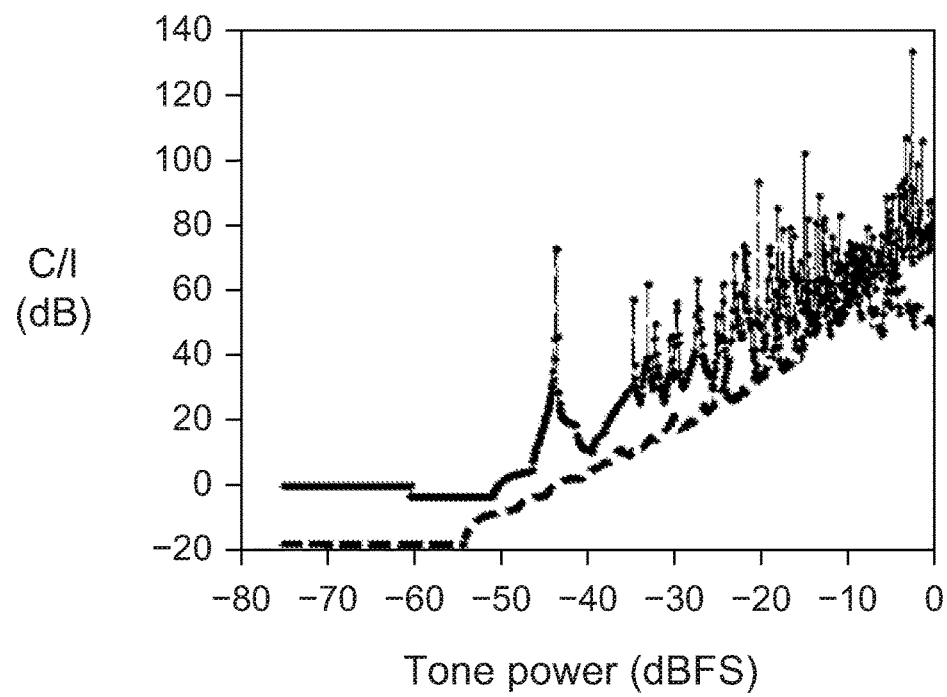
FIGS. 8A and 8B graphically illustrate the improvement in the carrier-to-interference ratio when a RNS ADC is substituted for a conventional 10-bit ADC, according to an embodiment of the present invention.
Figure 8B:
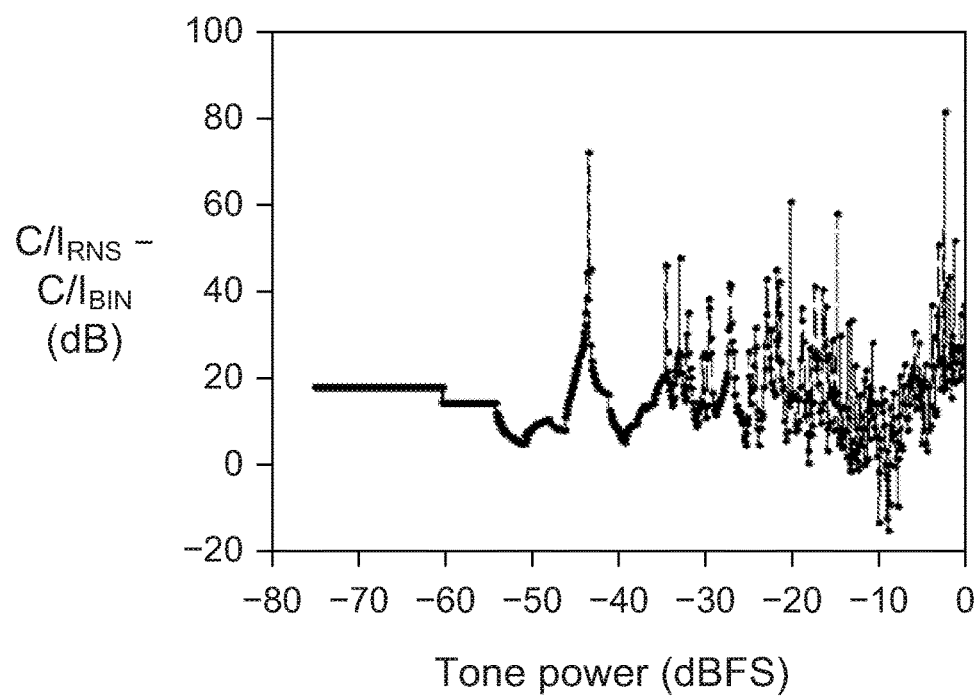

Investigations by the inventor have shown that the improvement is not limited to the 12-bit example illustrated in FIGS. 7A and 7B, and does not depend on a particular choice of RNS moduli. As a further example, FIGS. 8A and 8B illustrate the improvement in C/I ratio when a RNS [5, 11, 19] ADC (solid line in FIG. 8A) is used instead of a conventional 10-bit ADC (dashed line in FIG. 8A).

Whilst certain embodiments of the present invention have been described above, the skilled person will understand that many variations and modifications are possible without departing from the scope of the invention as defined in the accompanying claims.

The invention claimed is:

1. Apparatus for measuring a phase angle from an analogue signal, the apparatus comprising:
   a residue number system RNS analogue-to-digital converter ADC arranged to output a plurality of digital samples from the first analogue signal according to a RNS scheme; and
   a phase measurement module arranged to measure a phase angle between the analogue signal and a reference signal, based on the reference signal and the digital samples output by the RNS ADC.

2. The apparatus of claim 1, further comprising:
   a RNS-to-binary converter connected between the RNS ADC and the phase measurement module, the RNS-to-binary converter being arranged to convert the RNS digital samples to binary values according to a binary coding scheme,
   wherein the phase measurement module is arranged to measure the phase angle based on the reference signal and the converted digital samples from the RNS-to-binary converter.

3. The apparatus of claim 1, wherein the phase measurement module comprises:
   a quadrature reference signal generator arranged to generate sine and cosine waveforms according to a frequency of the reference signal;
   a first multiplier arranged to multiply the digital samples by the cosine waveform to obtain an in-phase I signal component;
   a second multiplier arranged to multiply the digital samples by the sine waveform to obtain a quadrature Q signal component;
   a first integrator arranged to integrate the I signal component over time;
   a second integrator arranged to integrate the Q signal component over time; and a phase angle calculator arranged to calculate the phase angle measurement from the integrated I and Q signal components.

4. The apparatus of claim 3, wherein the first and second integrators are arranged to integrate the I and Q signal components over a time period equal to an integer number of cycles of the reference signal.

5. The apparatus of claim 3, wherein the phase angle calculator is arranged to calculate the phase angle measurement using a Coordinate Rotation Digital Computer CORDIC algorithm.

6. Apparatus comprising:
a main signal path including an analogue-to-digital converter ADC arranged to convert an input signal to a digital signal, a digital signal processor arranged to perform digital signal processing on the digital signal, and a digital-to-analogue converter DAC arranged to convert the processed digital signal to an output signal; and
the apparatus of claim 1, arranged to receive the output signal from the DAC as the analogue signal for measuring the phase angle, wherein the reference signal is injected into the main signal path before the ADC.

7. A satellite comprising the apparatus of claim 1.

8. A method of measuring a phase angle between an analogue signal and a reference signal, the method comprising:
using a residue number system RNS analogue-to-digital converter ADC to output a plurality of digital samples from the analogue signal according to a RNS scheme; and
measuring a phase angle based on the reference signal and the digital samples.

9. The method of claim 8, further comprising:
converting the RNS digital samples to binary values according to a binary coding scheme,
wherein the phase angle is measured based on the reference signal and the converted digital samples.

10. The method of claim 8, wherein measuring the phase angle comprises:
generating sine and cosine waveforms according to a frequency of the reference signal;
multiplying the digital samples by the cosine waveform to obtain an in-phase I signal component;
multiplying the digital samples by the sine waveform to obtain a quadrature Q signal component;
integrating the I signal component over time;
integrating the Q signal component over time; and
calculating the phase angle measurement from the integrated I and Q signal components.

11. The method of claim 10, wherein the I and Q signal components are integrated over a time period equal to an integer number of cycles of the reference signal.

12. The method of claim 10, wherein the phase angle measurement is calculated using a Coordinate Rotation Digital Computer CORDIC algorithm.

13. The method of claim 8, further comprising:
injecting the reference signal into a main signal path including an analogue-to-digital converter ADC arranged to convert an input signal to a digital signal, a digital signal processor arranged to perform digital signal processing on the digital signal, and a digital-to-analogue converter DAC arranged to convert the processed digital signal to an output signal; and
receiving the output signal from the DAC as the analogue signal for measuring the phase angle.

* * * * *